US012803242B2

(12) United States Patent
Wu et al.

(10) Patent No.: US 12,803,242 B2
(45) Date of Patent: Nov. 17, 2026

(54) CAVITY-MOUNTED CHIPS WITH MULTIPLE ADHESIVES

(71) Applicant: GlobalFoundries U.S. Inc., Malta, NY (US)

(72) Inventors: Zhuojie Wu, Port Chester, NY (US); Koushik Ramachandran, Wappingers Falls, NY (US); Yusheng Bian, Ballston Lake, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 1045 days.

(21) Appl. No.: 17/982,606

(22) Filed: Nov. 8, 2022

(65) Prior Publication Data

US 2024/0154384 A1 May 9, 2024

(51) Int. Cl.
*H01S 5/0236* (2021.01)
*H01S 5/02251* (2021.01)
(Continued)

(52) U.S. Cl.
CPC ........ *H01S 5/0236* (2021.01); *H01S 5/02251* (2021.01); *H01S 5/02326* (2021.01); *H01S 5/024* (2013.01)

(58) Field of Classification Search
CPC ....... H01S 5/02355-0237; H01S 5/024; H01S 5/02461; H01S 5/02326
See application file for complete search history.

(56) References Cited

U.S. PATENT DOCUMENTS 5,729,561 A * 3/1998 Hironaka .............. H01S 5/0234 372/36
5,780,875 A * 7/1998 Tsuji .................... G02B 6/4246 385/83
(Continued)

FOREIGN PATENT DOCUMENTS

CN 110518453 A * 11/2019 ......... H01S 5/02469
DE 112020002906 T5 * 3/2022 ............ H10W 76/60
(Continued)

OTHER PUBLICATIONS

Y. Bian et al., "Hybrid III-V laser integration on a monolithic silicon photonic platform," in Optical Fiber Communication Conference (OFC) 2021, P. Dong, J. Kani, C. Xie, R. Casellas, C. Cole, and M. Li, eds., OSA Technical Digest (Optica Publishing Group, 2021), paper M5A.2.
(Continued)

*Primary Examiner* — Joshua King
(74) *Attorney, Agent, or Firm* — Thompson Hine LLP; Anthony Canale

(57) ABSTRACT

Structures for a cavity-mounted chip and methods of fabricating a structure for a cavity-mounted chip. The structure comprises a laser chip including a body attached to a substrate. The laser chip has an output, and the body of the laser chip has a bottom surface spaced from the substrate by a gap. The structure further comprises a first adhesive in the first gap and a second adhesive positioned in the first gap between the first adhesive and the output of the laser chip. The first adhesive has a first thermal conductivity, the second adhesive has a second thermal conductivity, and the first thermal conductivity of the first adhesive is greater than the second thermal conductivity of the second adhesive.

20 Claims, 6 Drawing Sheets

(51) Int. Cl.
*H01S 5/02326* (2021.01)
*H01S 5/024* (2006.01)

(56) References Cited

U.S. PATENT DOCUMENTS

| | | | | |
|---|---|---|---|---|
| 8,014,638 | B2 * | 9/2011 | Nakano | G02B 6/43 385/14 |
| 8,283,683 | B2 * | 10/2012 | Tsai | H10H 20/018 257/E33.056 |
| 9,316,785 | B2 * | 4/2016 | Krasulick | G02B 6/1225 |
| 9,606,308 | B2 | 3/2017 | Barwicz et al. | |
| 9,698,072 | B2 | 7/2017 | Brofman et al. | |
| 9,882,073 | B2 * | 1/2018 | Krasulick | H10F 77/413 |
| 10,312,661 | B2 * | 6/2019 | Lambert | G02B 6/122 |
| 11,075,122 | B2 | 7/2021 | Shioda et al. | |
| 11,217,460 | B2 | 1/2022 | Kulkarni et al. | |
| 2003/0006225 | A1 * | 1/2003 | Choa | H01S 5/06256 219/494 |
| 2006/0093002 | A1 * | 5/2006 | Park | H01S 5/0236 372/50.1 |
| 2008/0008217 | A1 * | 1/2008 | Miller | H01S 5/024 372/36 |
| 2010/0232462 | A1 * | 9/2010 | Shen | G02B 6/42 372/36 |
| 2011/0249694 | A1 * | 10/2011 | Nishiguchi | H01S 5/0234 257/E33.056 |
| 2012/0044967 | A1 * | 2/2012 | Cole | G11B 5/105 372/92 |
| 2015/0097210 | A1 * | 4/2015 | Krasulick | H01S 5/026 257/184 |
| 2015/0097211 | A1 * | 4/2015 | Krasulick | H01S 5/021 257/184 |
| 2015/0098676 | A1 * | 4/2015 | Krasulick | G02B 6/1225 438/27 |
| 2015/0099318 | A1 * | 4/2015 | Krasulick | H01S 5/021 438/27 |
| 2016/0218482 | A1 * | 7/2016 | Tayebati | H01S 5/0237 |
| 2016/0254639 | A1 * | 9/2016 | Watanabe | H01S 5/4025 372/36 |
| 2018/0081118 | A1 * | 3/2018 | Klamkin | H01S 5/02326 |
| 2018/0138664 | A1 * | 5/2018 | Huelsewede | H01S 5/02355 |
| 2018/0156972 | A1 * | 6/2018 | Kainuma | G02B 6/12004 |
| 2019/0068936 | A1 * | 2/2019 | Takagi | G02B 27/141 |
| 2020/0126887 | A1 | 4/2020 | Lin et al. | |
| 2020/0295533 | A1 * | 9/2020 | Bachmann | H01S 5/02461 |
| 2021/0336411 | A1 * | 10/2021 | Dejima | H01S 5/02385 |
| 2022/0075112 | A1 | 3/2022 | Cardile et al. | |
| 2022/0231477 | A1 * | 7/2022 | Lam | H01S 5/023 |
| 2024/0348005 | A1 * | 10/2024 | Wu | H01S 5/02345 |

FOREIGN PATENT DOCUMENTS

| | | | | | |
|---|---|---|---|---|---|
| JP | H11346031 | A * | 12/1999 | H01S 5/4025 |
| JP | 2002335034 | A * | 11/2002 | H01S 5/02345 |
| JP | 2004349294 | A * | 12/2004 | H01S 5/023 |
| JP | 2005191373 | A * | 7/2005 | |
| JP | 2008211026 | A * | 9/2008 | |
| JP | WO2020144794 | A1 * | 9/2021 | H01S 5/4087 |
| WO | WO-2017141347 | A1 * | 8/2017 | H01S 5/0239 |
| WO | WO-2019230826 | A1 * | 12/2019 | H10W 40/255 |
| WO | WO-2020225952 | A1 * | 11/2020 | H01S 5/4062 |
| WO | WO-2023144344 | A1 * | 8/2023 | H01S 5/0421 |

OTHER PUBLICATIONS

Y. Bian et al., "3D Integrated Laser Attach Technology on 300-mm Monolithic Silicon Photonics Platform," 2020 IEEE Photonics Conference (IPC), 2020, pp. 1-2, doi: 10.1109/IPC47351.2020.9252280.

W. S. Lee, I. Y. Han, Jin Yu, S. J. Kim and T. Y. Lee, "Thermal characterization of thermally conductive underfill for a lip-chip package using novel temperature sensing technique," Proceedings of 6th Electronics Packaging Technology Conference (EPTC 2004) (IEEE Cat. No. 04EX971), 2004, pp. 47-52, doi: 10.1109/EPTC.2004.1396575.

P. Zhu et al., "Underfill technology for fine pitch flip chip applications," 2016 17th International Conference on Electronic Packaging Technology (ICEPT), 2016, pp. 213-217, doi: 10.1109/ICEPT.2016.7583122.

Lee Sanchez, W.A.; Huang, C.-Y.; Chen, J.-X.; Soong, Y.-C.; Chan, Y.-N.; Chiou, K.-C.; Lee, T.-M.; Cheng, C.-C.; Chiu, C.-W. "Enhanced Thermal Conductivity of Epoxy Composites Filled with Al2O3/Boron Nitride Hybrids for Underfill Encapsulation Materials." Polymers 2021, 13, 147. https://doi.org/10.3390/polym13010147.

Malinowski, John C et al., "Thermal Performance for Radio Frequency (RF) Chip Packages" filed on Sep. 2, 2022 as a U.S. Appl. No. 17/902,506.

* cited by examiner

CAVITY-MOUNTED CHIPS WITH MULTIPLE ADHESIVES

BACKGROUND

This disclosure relates to photonics chips and, more specifically, to structures for a cavity-mounted chip and methods of fabricating a structure for a cavity-mounted chip.

Photonics chips are used in many applications and systems including, but not limited to, data communication systems and data computation systems. A photonics chip integrates optical components and electronic components into a unified platform. Among other factors, layout area, cost, and operational overhead may be reduced by the integration of both types of components on the same chip.

A laser source may be integrated on the photonics chip. In that regard, a cavity may be formed in the substrate, and the laser source may be inserted into the cavity and attached to the substrate. A laser source generates significant amount of heat during operation. The performance and reliability life of the laser source is tied to effective thermal management. In conventional photonics chips, laser-generated heat is primarily dissipated to the substrate through solder contact at the attachment locations and an optical coupling adhesive.

Improved structures for a cavity-mounted chip and methods of fabricating a structure for a cavity-mounted chip are needed.

SUMMARY

In an embodiment of the invention, a structure comprises a laser chip including a body attached to a substrate. The laser chip has an output, and the body of the laser chip has a bottom surface spaced from the substrate by a gap. The structure further comprises a first adhesive in the first gap and a second adhesive positioned in the first gap between the first adhesive and the output of the laser chip. The first adhesive has a first thermal conductivity, the second adhesive has a second thermal conductivity, and the first thermal conductivity of the first adhesive is greater than the second thermal conductivity of the second adhesive.

In an embodiment of the invention, a method comprises attaching a body of a laser chip to a substrate. The body of the laser chip has a bottom surface spaced from the substrate by a gap. The method further comprises forming a first adhesive in the gap, and forming a second adhesive positioned in the gap between the first adhesive and an output of the laser chip. The first adhesive has a first thermal conductivity, the second adhesive has a second thermal conductivity, and the first thermal conductivity of the first adhesive is greater than the second thermal conductivity of the second adhesive.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
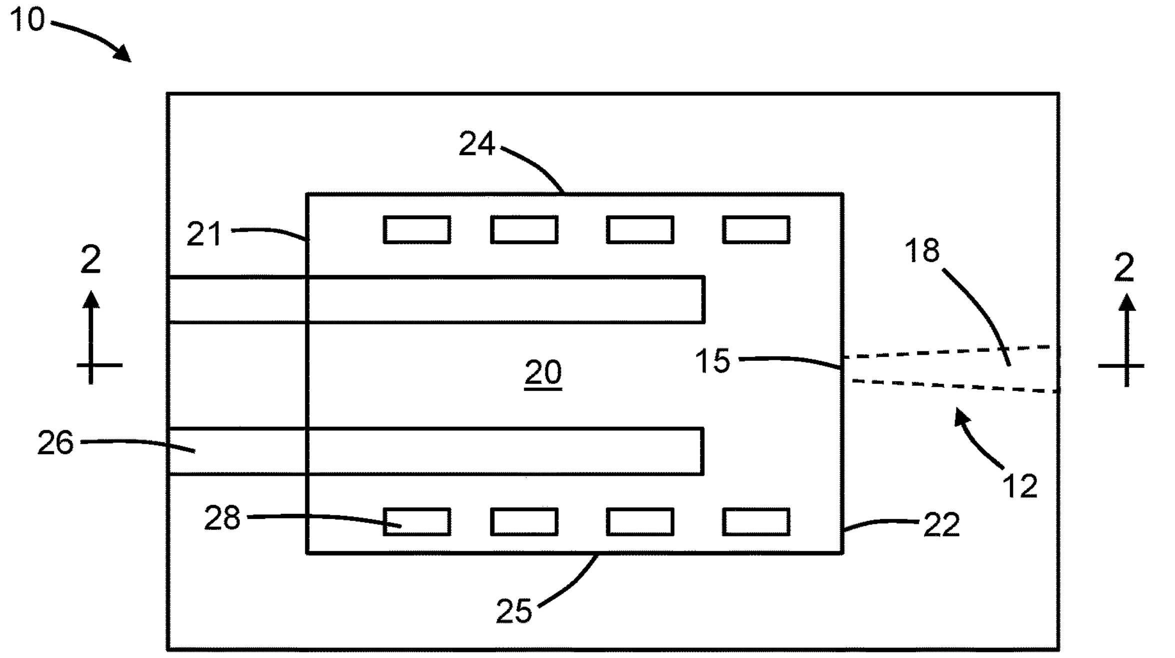
FIG. 1 is a top view of a structure at an initial fabrication stage of a processing method in accordance with embodiments of the invention.
Figure 2:
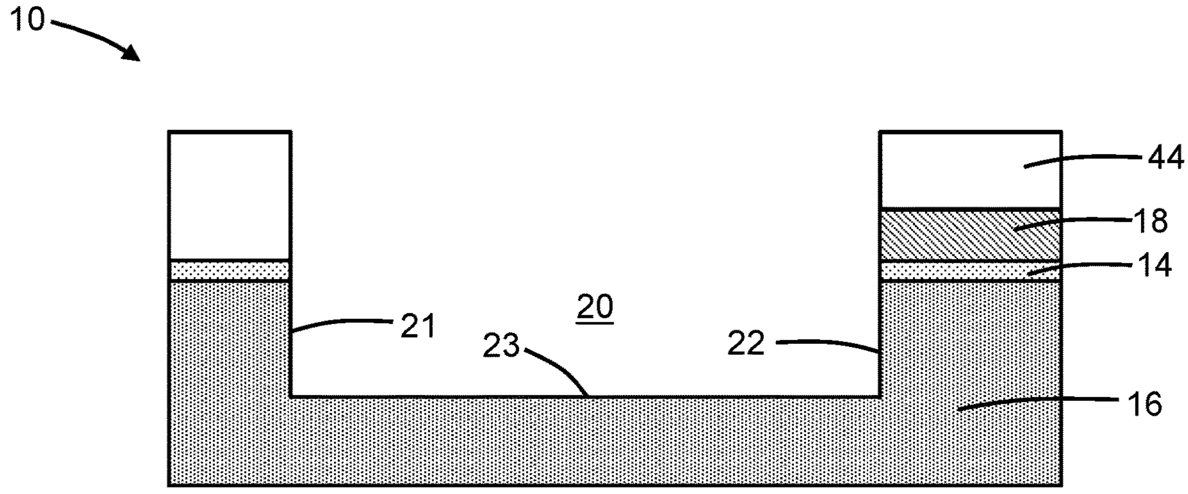
FIG. 2 is a cross-sectional view taken generally along line 2-2 in FIG. 1.

With reference to FIGS. 1, 2 and in accordance with embodiments of the invention, a structure 10 for a photonics chip includes a waveguide core 12 that is positioned on, and over, a dielectric layer 14 and a substrate 16. In an embodiment, the dielectric layer 14 may be comprised of a dielectric material, such as silicon dioxide, and the substrate 16 may be comprised of a semiconductor material, such as single-crystal silicon. In an embodiment, the dielectric layer 14 may be a buried oxide layer of a silicon-on-insulator substrate, and the dielectric layer 14 may separate the waveguide core 12 from the substrate 16. In an alternative embodiment, one or more additional dielectric layers comprised of, for example, silicon dioxide may be positioned between the waveguide core 12 and the dielectric layer 14.

In an embodiment, the waveguide core 12 may be comprised of a material having a refractive index that is greater than the refractive index of silicon dioxide. In an embodiment, the waveguide core 12 may be comprised of a semiconductor material, such as single-crystal silicon or polysilicon. In an alternative embodiment, the waveguide core 12 may be comprised of a dielectric material, such as silicon nitride, silicon oxynitride, or aluminum nitride. In alternative embodiments, other materials, such as a polymer or a III-V compound semiconductor, may be used to form the waveguide core 12.

In an embodiment, the waveguide core 12 may be formed by patterning a layer of constituent material with lithography and etching processes. In an embodiment, an etch mask may be formed by a lithography process over the layer, and unmasked sections of the deposited layer may be etched and removed by an etching process. The shape of the etch mask may determine the patterned shape of the waveguide core 12. In an embodiment, the waveguide core 12 may be formed by patterning the semiconductor material (e.g., single-crystal silicon) of a device layer of a silicon-on-insulator substrate.

The waveguide core 12 may include a tapered section 18 that defines a spot-size converter arranged to receive light of a given mode from a light source, such as a laser. The tapered section 18 may have a narrow end 15 defining a facet that is eventually arranged proximate to the light source and a wide end that is connected to another section of the waveguide core 12 used to route the light to functional circuits on the photonics chip. The gradually-varying cross-section area of the tapered section 18 may support mode transformation and mode size variation associated with mode conversion when receiving light from the light source.

A dielectric layer 44 may be formed over the waveguide core 12 and dielectric layer 14 adjacent to the cavity 20. The dielectric layer 44 may be comprised of a dielectric material, such as silicon dioxide. The dielectric layer 44 may replace a removed section of a back-end-of-line stack.

A cavity 20 is formed that penetrates through the dielectric layer 14 and into the substrate 16. The cavity 20 may be formed by one or more lithography and etching processes. The portion of the cavity 20 in the substrate 16 includes sidewalls 21, 22 and sidewalls 24, 25 that are arranged about, and surround, the cavity 20. The narrow end 15 of the tapered section 18 of the waveguide core 12 is positioned adjacent to the sidewall 22. Conductive traces 26 may be formed that lead from a bottom or floor 23 of the cavity 20 up the sidewall 21 and onto a surface adjacent to the cavity 20. The cavity 20 extends through the dielectric layer 44 to the substrate 16, and the conductive traces 26 may extend onto a surface of the dielectric layer 44. Mechanical stops 28, which may be patterned portions of the dielectric layer 14, are arranged adjacent to the opposite sidewalls 24, 25 of the cavity 20.

Figure 3:
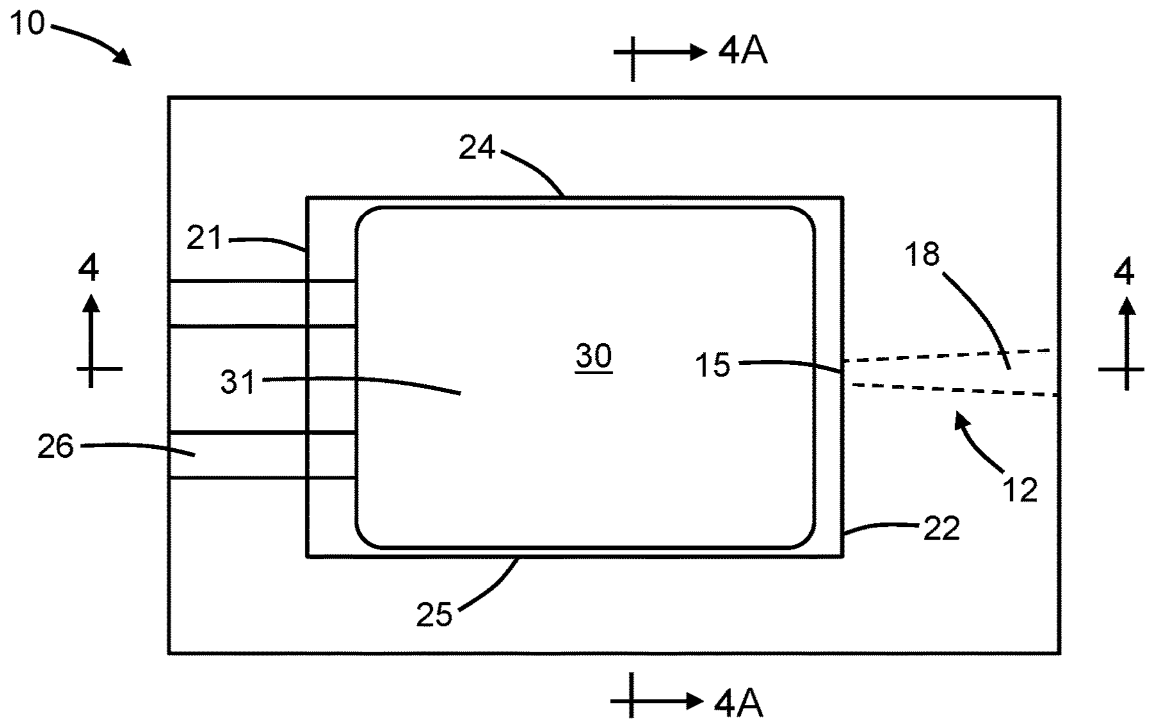
FIG. 3 is a top view of the structure at a fabrication stage subsequent to FIG. 1.
Figure 4:
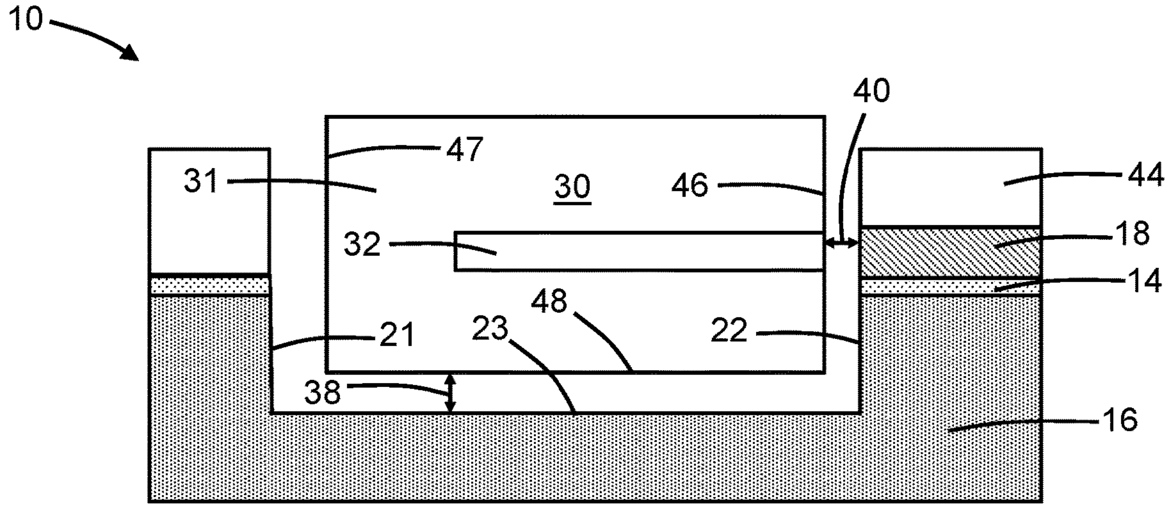
FIG. 4 is a cross-sectional view taken generally along line 4-4 in FIG. 3.
Figure 4A:
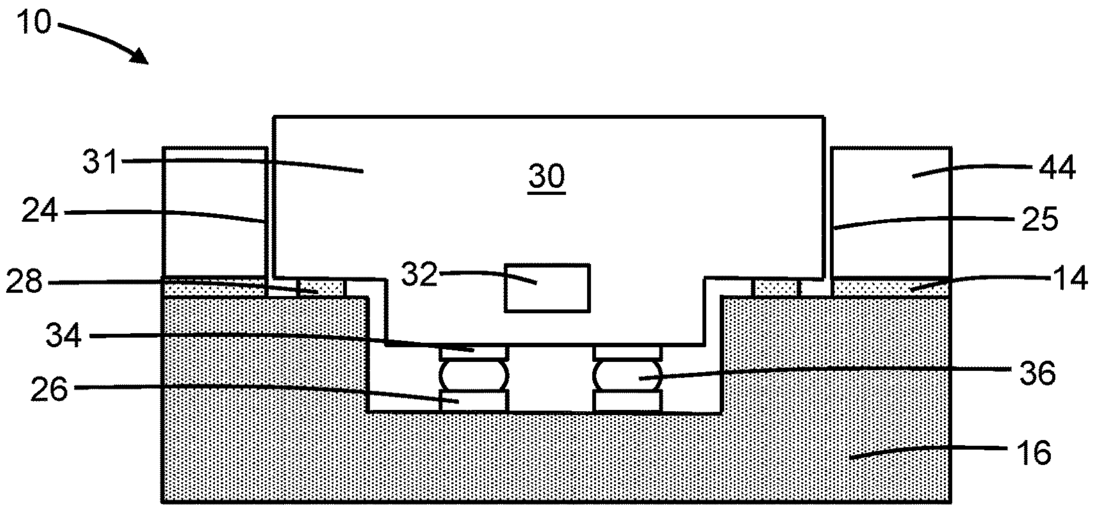
FIG. 4A is a cross-sectional view taken generally along line 4A-4A in FIG. 3.

With reference to FIGS. 3, 4, 4A in which like reference numerals refer to like features in FIGS. 1, 2 and at a subsequent fabrication stage, a laser chip 30 is positioned in the cavity 20 such that an output 32 for laser light is aligned with the narrow end 15 of the tapered section 18 of the waveguide core 12. The shape and dimensions of the cavity 20 may be correlated with the shape and dimensions of the laser chip 30 such that the laser chip 30 can be inserted into the cavity 20. In that regard, the dimensions of the cavity 20 may be slightly greater than the dimensions of the laser chip 30 to provide clearance for insertion into the cavity 20. In an embodiment, the output 32 of the laser chip 30 may be butt coupled with, and adjacent to, the narrow end 15 of the tapered section 18 of the waveguide core 12.

In an embodiment, the laser chip 30 may be configured to emit laser light of a given wavelength, intensity, mode shape, and mode size. In an embodiment, the laser chip 30 may include a laser comprised of III-V compound semiconductor materials. In an embodiment, the laser chip 30 may include an indium phosphide/indium-gallium-arsenic phosphide laser that is configured to generate continuous laser light in an infrared wavelength range for emission from the output 32. For example, the laser included in the laser chip 30 may generate and output laser light at a nominal peak wavelength of 1310 nm or at a nominal peak wavelength of 1550 nm.

In an alternative embodiment, the laser chip 30 may include a semiconductor optical amplifier that is configured to amplify the optical power of laser light. An additional waveguide core similar to the waveguide core 12 may be provided to function as an input to the semiconductor optical amplifier, and the waveguide core 12 may provide an output from the semiconductor optical amplifier.

The laser chip 30 has a body 31 with a surface 48 that is spaced from the floor 23 of the cavity 20 by a gap 38. The output 32 of the laser chip 30 may be spaced from the tapered section 18 of the waveguide core 12 by a gap 40. The body 31 of the laser chip 30 also has a side surface 46 and a side surface 47 opposite to the side surface 46. The side surface 46 of the body 31 of the laser chip 30 is adjacent to the sidewall 22 of the cavity 20 and is spaced from the sidewall 22 of the cavity 20 by a gap, and the side surface 47 of the body 31 of the laser chip 30 is adjacent to the sidewall 21 of the cavity 20 and spaced from the sidewall 21 of the cavity 20 by a gap.

The laser chip 30 may have the form of a flip-chip package that includes pads 34 that are exposed at the surface 48 and connected to conductive paths inside the body 31 of the laser chip 30. The pads 34 may be attached to the conductive traces 26 by solder balls or solder bumps 36 and the conductive paths may be used to power the laser of the laser chip 30. The attachment process may include inserting the laser chip 30 into the cavity 20 and reflowing the solder in the balls or solder bumps 36 such that the laser chip 30 is mechanically and electrically connected to the conductive traces 26.

The laser chip 30 may contact the mechanical stops 28 after attachment. As a result, the mechanical stops 28 provide passive alignment of the attached laser chip 30 in a vertical direction, and the height of the mechanical stops 28 may define the vertical dimension of the gap 38 after attachment. In an embodiment, the tapered section 18 of the waveguide core 12 may be longitudinally aligned substantially collinear with the light emitted from the output 32 from the laser chip 30. In an alternative embodiment, the tapered section 18 of the waveguide core 12 may be angled relative to the output 32 from the laser chip 30 to provide non-normal incidence, which may reduce back reflection of light from the waveguide core 12 to the laser chip 30. In alternative embodiments, additional waveguide cores may be arranged adjacent to the tapered section 18 of the waveguide core 12, such as a trident arrangement with the tapered section 18 of the waveguide core 12 positioned between a pair of added waveguide cores. In an alternative embodiment, the tapered section 18 of the waveguide core 12 may be segmented to define a subwavelength metamaterial structure and may optionally include a central rib overlaid on the segments.

Figure 5:
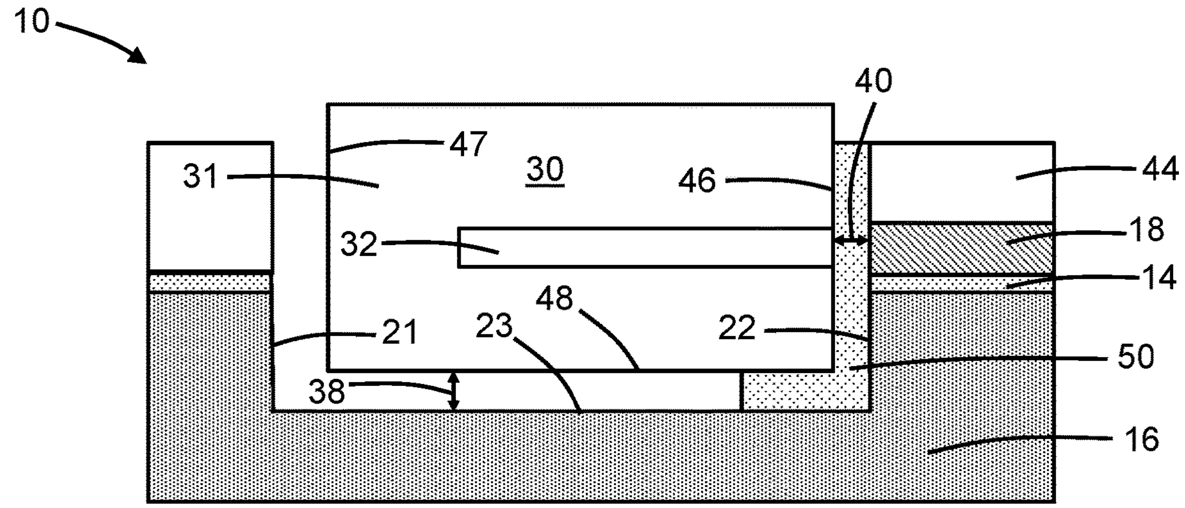
FIG. 5 is a cross-sectional view of the structure at a fabrication stage subsequent to FIG. 4.

With reference to FIG. 5 in which like reference numerals refer to like features in FIG. 4 and at a subsequent fabrication stage, an adhesive 50 may be formed that is positioned in a portion of the gap 38 between the surface 48 of the body 31 of the laser chip 30 and the floor 23 of the cavity 20. The adhesive 50 is also positioned in the gap 40 between the output 32 of the laser chip 30 and the tapered section 18 of the waveguide core 12, as well as in the gap between the side surface 46 of the laser chip 30 and the sidewall 22 of the cavity 20. The adhesive 50, which may be highly flowable before curing, may be dispensed adjacent to the laser chip 30 and allowed to wick, via capillary action, between the laser chip 30 and the cavity 20. The adhesive 50 may be concurrently or almost concurrently cured during dispensing such that the flow of the adhesive 50 across the gap 38 is limited. For example, the adhesive 50 may be cured using ultraviolet light, during dispensing, to limit the extent of the flow across the gap 38.

The adhesive 50 in the gap 40 may be positioned between the output 32 of the laser chip 30 and the tapered section 18 of the waveguide core 12. In an embodiment, the adhesive 50 may contact the surface 48 of the body 31 of the laser chip 30. In an embodiment, the adhesive 50 may directly contact the surface 48 of the body 31 of the laser chip 30. In an embodiment, the adhesive 50 may contact the floor 23 of the cavity 20. In an embodiment, the adhesive 50 may directly contact the floor 23 of the cavity 20. In an embodiment, the adhesive 50 may contact the surface 48 of the body 31 of the laser chip 30 and the floor 23 of the cavity 20 such that the gap 38 is bridged. In an embodiment, the adhesive

50 may directly contact the surface 48 of the body 31 of the laser chip 30 and the floor 23 of the cavity 20 such that the gap 38 is bridged.

The adhesive 50 may be characterized by optical properties that are optimized to promote light coupling between the laser chip 30 and the tapered section 18 of the waveguide core 12 and to provide a refractive index match between the laser chip 30 and the tapered section 18 of the waveguide core 12. The optical properties of the adhesive 50 may also be optimized to reduce back reflection from the waveguide core 12 to the output 32 of the laser chip 30.

Figure 6:
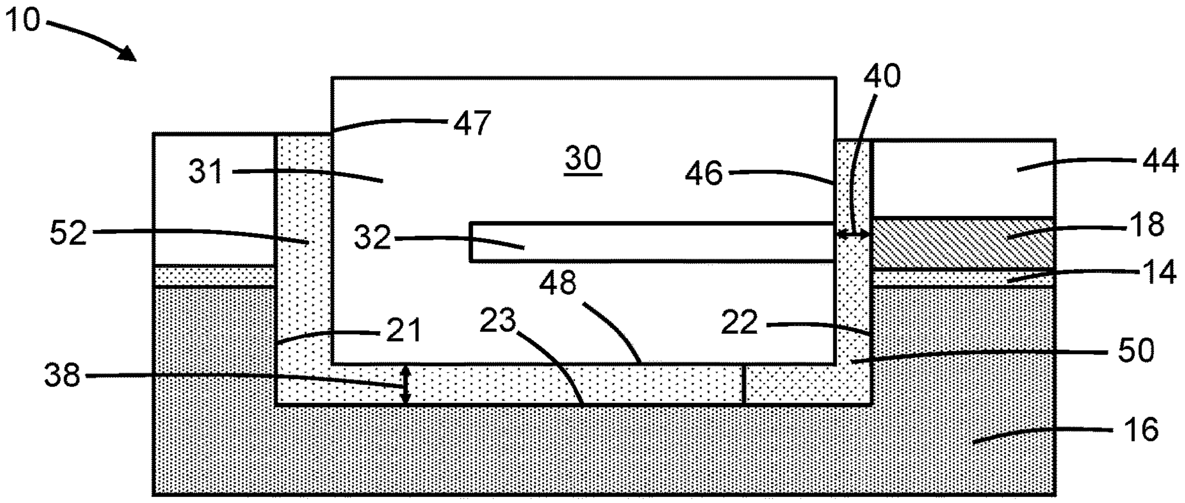
FIG. 6 is a cross-sectional view of the structure at a fabrication stage subsequent to FIG. 5.

With reference to FIG. 6 in which like reference numerals refer to like features in FIG. 5 and at a subsequent fabrication stage, an adhesive 52 is formed in the portion of the gap 38 that is unfilled by the adhesive 50. The adhesive 52 is also positioned in the gap between the side surface 47 of the laser chip 30 and the sidewall 21 of the cavity 20. The adhesive 52, which may be highly flowable before curing, may be dispensed adjacent to the laser chip 30 and allowed to wick, via capillary action, between the laser chip 30 and the cavity 20, followed by a thermal cure of both adhesives 50, 52.

In an embodiment, the adhesive 52 may extend fully from the floor 23 of the cavity 20 to the surface 48 of the body 31 of the laser chip 30 such that the gap 38 is bridged. In an embodiment, the adhesive 52 may contact the surface 48 of the body 31 of the laser chip 30. In an embodiment, the adhesive 52 may directly contact the surface 48 of the body 31 of the laser chip 30. In an embodiment, the adhesive 52 may contact the adhesive 50 inside the gap 38. In an embodiment, the adhesive 52 may directly contact the adhesive 50 inside the gap 38.

The adhesive 52 has a different composition than the adhesive 50. In an embodiment, the adhesive 52 may include an organic binder and a particle filler distributed in the organic binder. For example, the adhesive 52 may be a composite including an organic binder and particles of an inorganic particle filler dispersed in the organic binder. The organic binder may be comprised of a polymer, an epoxy, or a resin. The particle filler in the adhesive 52 may include particles comprised of silicon dioxide, boron oxide, calcium oxide, carbon, aluminum nitride, or boron nitride. In an embodiment, the particle filler in the adhesive 52 may have a mean particle size of about one micron. In an embodiment, the adhesive 52 may have a higher thermal conductivity than the adhesive 50, which leads to a reduction in thermal impedance during operation. In an embodiment, the adhesive 52 may have a thermal conductivity that is greater than or equal to 0.2 W/m-K. The thermal conductivity of the adhesive 52 may be tailored through properties such as the particle size and the filler content of the particles (i.e., particle concentration in weight percent) in the binder. The adhesive 52 may be chosen to have a coefficient of thermal expansion and modulus that is independent of the adhesive 50, which may permit an improvement in the mechanical properties in comparison with a full fill by an adhesive lacking a particle filler.

The combination of adhesives 50, 52 may permit both optical requirements and thermal requirements to be satisfied for a given application of the structure 10. The adhesive 50 preserves the improvement in optical coupling arising from index matching, and the adhesive 52 improves the ability to conduct heat generated by the laser chip 30 from the laser chip 30 to the substrate 16. The particle concentration in the adhesive 52 may also improve the thermomechanical reliability of the structure 10.

In an alternative embodiment, the laser chip 30 may be attached to a top surface of either the dielectric layer 14 or a top surface of the substrate 16 instead of being attached inside the cavity 20. The gap 38 would then exist between the top surface and the body 31 of the laser chip 30.

Figure 7:
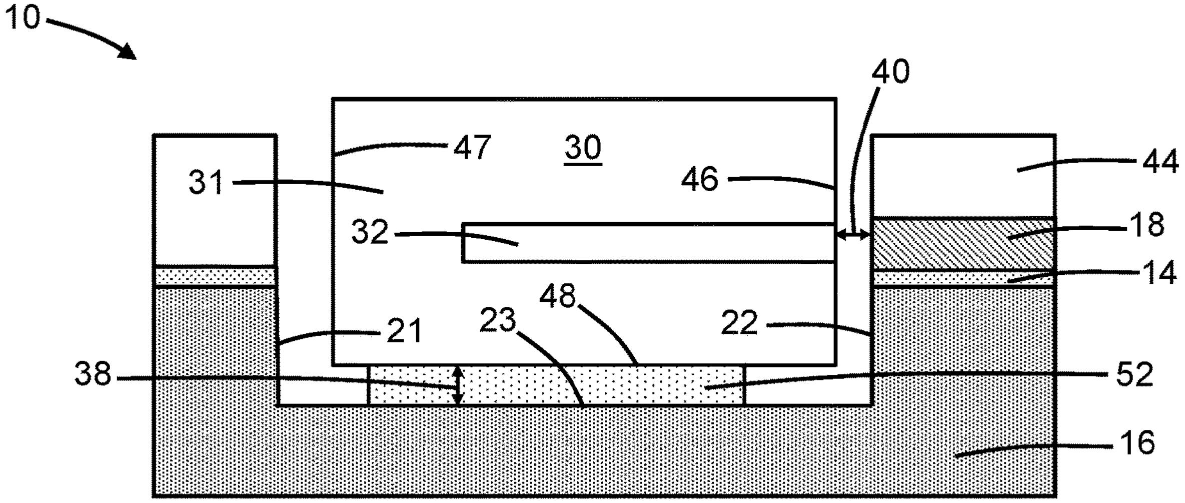
FIGS. 7 and 8 are cross-sectional views of a structure at successive fabrication stages of a processing method in accordance with alternative embodiments of the invention.

With reference to FIG. 7 in which like reference numerals refer to like features in FIG. 2 and at a subsequent fabrication stage in accordance with alternative embodiments, the adhesive 52 may be applied in a portion of the gap 38 before attaching the laser chip 30 and before applying the adhesive 50. The adhesive 52 may be comprised of a material that exhibits negligible flow due to a high viscosity. The laser chip 30 is inserted into the cavity 20 and attached to the substrate 16 after the adhesive 52 is applied. In an embodiment, the adhesive 52 may be comprised of filler particles (i.e., nanoparticles) with a sub-micron particle size.

Figure 8:
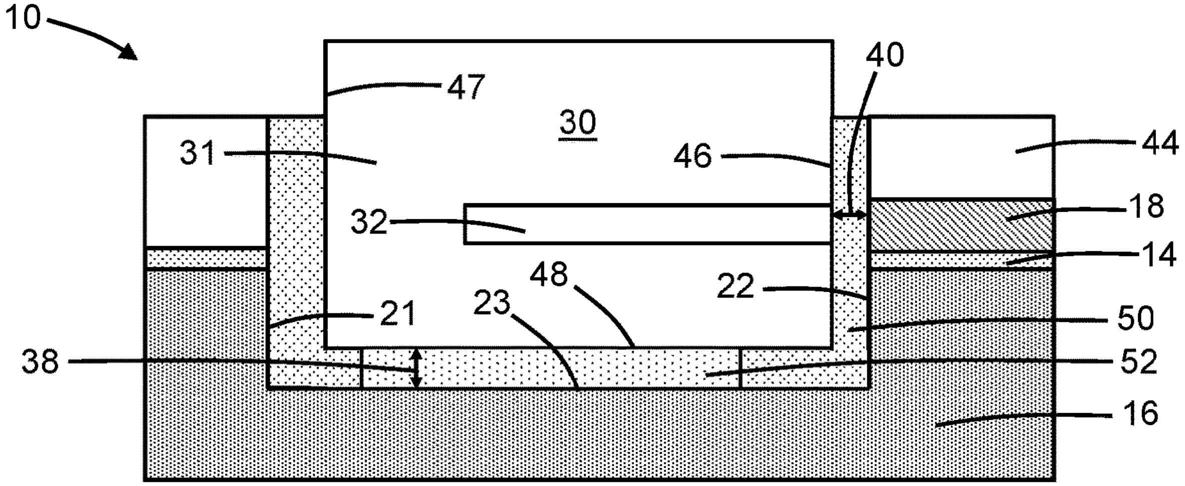

With reference to FIG. 8 in which like reference numerals refer to like features in FIG. 7 and at a subsequent fabrication stage, the adhesive 50 may be applied after attaching the laser chip 30 to the substrate 16. The adhesive 50 may fill the portions of the gap 38 unfilled by the adhesive 52, the gap 40, the gap between the side surface 46 of the body 31 of the laser chip 30 and the sidewall 22 of the cavity 20, and the gap between the side surface 47 of the body 31 of the laser chip 30 and the sidewall 21 of the cavity 20.

Figure 9:
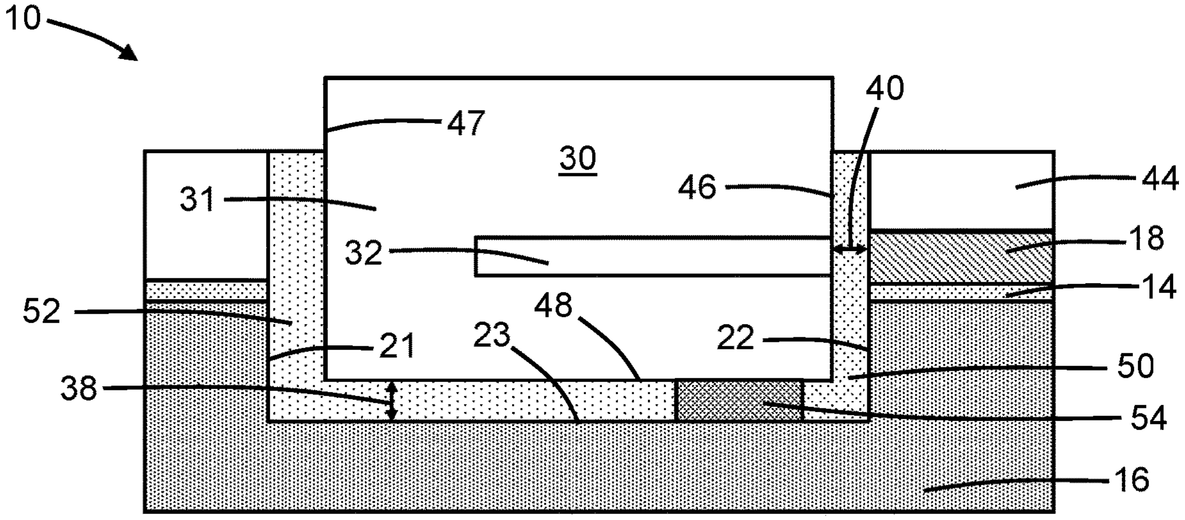
FIG. 9 is a cross-sectional view of the structure in accordance with alternative embodiments of the invention.

With reference to FIG. 9 and in accordance with alternative embodiments, an adhesive 54 may be applied in the gap 38 before applying either the adhesive 50 or the adhesive 52. In an embodiment, the adhesive 54 may be a composite including an organic binder and particles of an inorganic particle filler dispersed in the organic binder. The organic binder may be comprised of a polymer, an epoxy, or a resin. The particle filler in the adhesive 54 may include particles comprised of silicon dioxide, boron oxide, calcium oxide, carbon, aluminum nitride, or boron nitride. The adhesive 54 has a different composition than either the adhesive 50 or the adhesive 52.

The adhesive 54 may function as a dam during the application of the adhesive 50 for controlling the flow of the adhesive 50 in the gap 38, which may eliminate the requirement for concurrently curing the adhesive 50 during its dispensing. In an embodiment, the adhesive 54 may contact the surface 48 of the body 31 of the laser chip 30. In an embodiment, the adhesive 54 may directly contact the surface 48 of the body 31 of the laser chip 30. In an embodiment, the adhesive 54 may contact the adhesive 50 inside the gap 38. In an embodiment, the adhesive 54 may contact the adhesive 52 inside the gap 38. In an embodiment, the adhesive 54 may contact the adhesive 50 and the adhesive 52 inside the gap 38. In an embodiment, the adhesive 54 may directly contact the adhesive 50 inside the gap 38. In an embodiment, the adhesive 54 may directly contact the adhesive 52 inside the gap 38. In an embodiment, the adhesive 54 may directly contact the adhesive 50 and the adhesive 52 inside the gap 38.

In an embodiment, the adhesive 54 before curing may have a higher viscosity than the adhesive 50 before curing. In an embodiment, the adhesive 54 before curing may have a higher viscosity than the adhesive 52 before curing. In an embodiment, the adhesive 54 before curing may have a higher viscosity before curing than either the adhesive 50 before curing or the adhesive 52 before curing.

The adhesive 54 may have a thermal conductivity that may be tailored through properties such as the particle size and the filler content of the particles (i.e., particle concentration in weight percent) in the binder. In an embodiment, the particle concentration of the filler in the adhesive 54 may be greater than the particle concentration of the filler in the adhesive 52. The higher particle concentration may also provide the enhanced viscosity of the adhesive 54 in comparison with the adhesive 52. In an embodiment, the adhesive 54 may have a thermal conductivity of greater than or equal to 1 W/m-K. In an embodiment, the adhesive 54 may be characterized as a thermal interface material. In an embodiment, the adhesive 54 may have a higher thermal conductivity than the adhesive 50, which may be due at least in part to the presence of the particle concentration. In an embodiment, the adhesive 54 may have a higher thermal conductivity than the adhesive 52, which may be due at least in part to the higher particle concentration. In an embodiment, the adhesive 54 may have a higher thermal conductivity than either the adhesive 50 or the adhesive 52.

Figure 10:
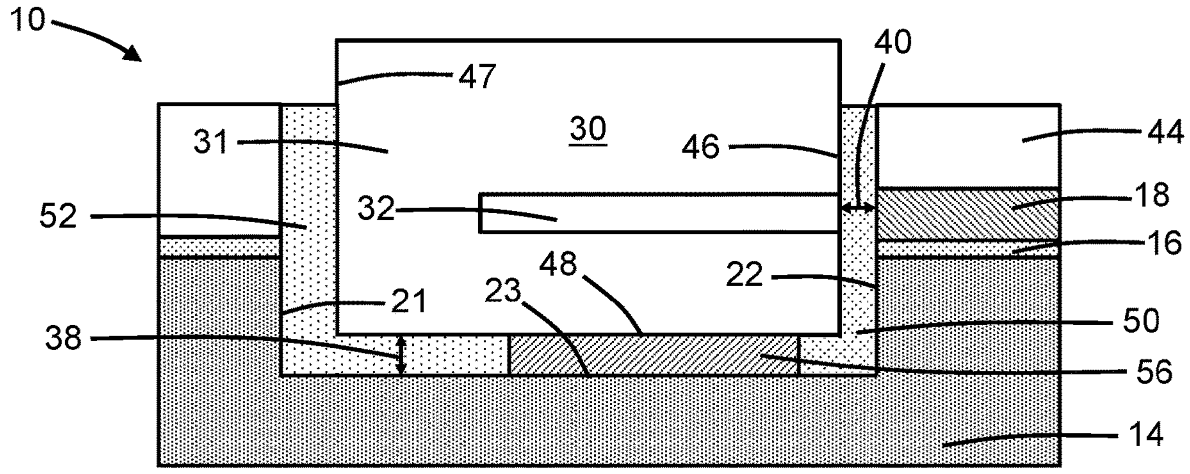
FIG. 10 is a cross-sectional view of the structure in accordance with alternative embodiments of the invention.

With reference to FIG. 10 and in accordance with alternative embodiments, the laser chip 30 may be attached to the conductive traces 26 by a single solder pad 56. The solder pad 56 may function as a dam during the application of the adhesive 50 to restrict flow of the adhesive 50 across the gap 38 and during the application of the adhesive 52 to restrict flow of the adhesive 52 across the gap 38. A portion of the adhesive 50, a portion of the adhesive 52, and the solder pad 56 are positioned within the gap 38 with the solder pad 56 is positioned between the adhesive 50 and the adhesive 52.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature with either direct contact or indirect contact.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:

a substrate including a waveguide core and a cavity, the cavity having a floor and a first sidewall, and the waveguide core positioned adjacent to the first sidewall;

a laser chip including a body attached to the substrate inside the cavity, the laser chip having an output and a bond pad, the body of the laser chip having a bottom surface spaced from the floor of the cavity by a first gap, and the waveguide core spaced from the output of the laser chip by a second gap;

a conductive trace on the floor of the cavity;

a solder bump configured to attach the conductive trace to the bond pad;

a first adhesive in the first gap, the first adhesive having a first thermal conductivity, and the first adhesive including an organic binder and a plurality of particles in the organic binder; and a second adhesive including a first portion positioned in the first gap and a second portion positioned in the second gap between the output of the laser chip and the waveguide core, the second adhesive having a second thermal conductivity, wherein the first thermal conductivity of the first adhesive is greater than the second thermal conductivity of the second adhesive.

2. The structure of claim 1 wherein the second adhesive is positioned between the first sidewall of the cavity and the body of the laser chip.

3. The structure of claim 1 wherein the first adhesive and the second adhesive each extend fully from the floor of the cavity to the bottom surface of the body of the laser chip.

4. The structure of claim 3 wherein the first adhesive and the second adhesive each contact the floor of the cavity, and the first adhesive and the second adhesive each contact the bottom surface of the body of the laser chip.

5. The structure of claim 1 further comprising:

a third adhesive positioned in the first gap between the first adhesive and the second adhesive.

6. The structure of claim 5 wherein the third adhesive has a third thermal conductivity, and the third thermal conductivity of the third adhesive is greater than the first thermal conductivity of the first adhesive.

7. The structure of claim 6 wherein the first thermal conductivity is greater than or equal to 0.2 W/m-K, and the third thermal conductivity is greater than or equal to 1 W/m-K.

8. The structure of claim 5 wherein the first adhesive includes a first plurality particles having a first particle concentration, the third adhesive includes a second plurality particles having a second particle concentration, and the second particle concentration is greater than the first particle concentration.

9. The structure of claim 1 wherein the laser chip includes a solder pad positioned in the first gap between the first adhesive and the second adhesive.

10. The structure of claim 1 wherein the plurality of particles comprise silicon dioxide, boron oxide, calcium oxide, carbon, aluminum nitride, or boron nitride.

11. The structure of claim 1 wherein the plurality of particles have a mean particle size of about one micron.

12. The structure of claim 1 wherein the first thermal conductivity is greater than or equal to 0.2 W/m-K.

13. The structure of claim 1 wherein the first adhesive is in contact with the second adhesive in the first gap.

14. A method comprising:

forming a cavity in a substrate, wherein the cavity has a floor and a sidewall, and the substrate includes a waveguide core positioned adjacent to the sidewall;

attaching a body of a laser chip to the substrate inside the cavity, wherein the laser chip has an output and a bond pad, the body of the laser chip has a bottom surface spaced from the floor of the cavity by a first gap, and the waveguide core is spaced from the output of the laser chip by a second gap;

forming a conductive trace on the floor of the cavity;

forming a solder bump configured to attach the conductive trace to the bond pad;

forming a first adhesive in the first gap, wherein the first adhesive has a first thermal conductivity, and the first adhesive includes an organic binder and a plurality of particles in the organic binder; and forming a second adhesive including a first portion positioned in the first gap and a second portion positioned in the second gap between the output of the laser chip and the waveguide core, wherein the second adhesive has a second thermal conductivity, and the first thermal conductivity of the first adhesive is greater than the second thermal conductivity of the second adhesive.

15. The structure of claim 1 further comprising:

a semiconductor substrate; and a dielectric layer separating the waveguide core from the semiconductor substrate.

16. The structure of claim 15 wherein the cavity penetrates fully through the dielectric layer and into the substrate.

17. The structure of claim 15 wherein the dielectric layer includes a plurality of patterned portions in the first gap that are configured to contact the bottom surface the body of the laser chip.

18. The structure of claim 15 wherein the cavity has a second sidewall opposite from the first sidewall, and the conductive trace extends up the second sidewall onto a surface of the dielectric layer.

19. The structure of claim 18 wherein the second adhesive includes a third portion between the body of the laser chip and the second sidewall.

20. The structure of claim 1 wherein the second adhesive has optical properties selected to provide a refractive index match between the laser chip and the waveguide core.

* * * * *